United States Patent

Smith

[15] 3,691,632

[45] Sept. 19, 1972

[54] METHOD OF MAKING MULTI LAYER CIRCUIT BOARDS

[72] Inventor: John Henry William Smith, Coventry, England

[73] Assignee: Microponent Development Ltd., Birmingham, England

[22] Filed: June 10, 1970

[21] Appl. No.: 45,073

[30] Foreign Application Priority Data

June 13, 1969 Great Britain..........30,014/69

[52] U.S. Cl.....................................29/625, 174/68.5

[51] Int. Cl.....................................B41m 3/08

[58] Field of Search.............29/625; 174/68.5; 1/624

[56] References Cited

UNITED STATES PATENTS

| | | | |
|---|---|---|---|
| 3,102,213 | 8/1963 | Bedson et al. | 174/68.5 |
| 3,571,923 | 3/1971 | Shaheen et al. | 29/625 |
| 3,274,328 | 9/1966 | Davis | 174/68.5 |

OTHER PUBLICATIONS

IBM Technical Disclosure Bulletin, Vol. 11, No. 10, 3/1969 Haining et al.

IBM Technical Disclosure Bulletin, Vol. 6, No. 11, 4/1964 Haddad

*Primary Examiner*—J. Spencer Overholser
*Assistant Examiner*—Norman Lehrer
*Attorney*—Friedman & Goodman

[57] ABSTRACT

A multi-layer circuit board assembly including a plurality of stacked conductor patterns electrically interconnected with one another within the assembly is formed by a method in which metal conductor patterns are formed sequentially and initially without electrical interconnection. Each successive conductor pattern is covered with a continuous layer of an insulating material so that the next conductor pattern which is formed on such insulating layer is totally insulated from the preceding conductor pattern. The insulating material is chosen to be of such a nature that it will not smear on a drill subsequently passed through the assembly, and the assembly is drilled through to form bores at selected positions which intersect the conductor patterns selectively where they require to be electrically interconnected. Such electrical interconnection is then established by depositing metal within the bores. Preferably the step of depositing metal in the bores forms an integral part of the process of forming the outermost conductor patterns.

9 Claims, 7 Drawing Figures

PATENTED SEP 19 1972 3,691,632

METHOD OF MAKING MULTI LAYER CIRCUIT BOARDS

BACKGROUND OF THE INVENTION

1. Field of the Invention

This invention relates to multi-layer circuit board assemblies including a plurality of stacked conductor patterns interconnected electrically with one another within the assembly.

2. Description of the Prior Art

One known way of forming such multi-layer circuits consists of bonding together a number of separate circuit boards, each having a metallic conductor pattern preformed thereon, by means of an intermediate layer of a resin or other adhesive material. The bonding process is performed with the application of heat and pressure. The bonded multi-layer assembly is then drilled through at predetermined points where electrical interconnection is required between the metal conductor patterns of different layers, and the holes thus formed are subsequently provided with metallic linings by means of a suitable deposition process in order to establish the required interconnection between the various metal conductor patterns.

However, during the drilling operation the drill tends to pick up traces of the adhesive layer and can deposit this material on the edges of the metal layers forming the conductor patterns. This deposit can create an insulating barrier between the metal of the conductor patterns and that which is subsequently deposited within the bores. In an extreme case the metal within the bore can be effectively completely electrically isolated from the conductor patterns so that when the assembly is subjected to further plating the required electrical interconnection between the various conductor patterns are not established. In less severe cases, electrical interconnection may be established, but a barrier afforded by the deposited adhesive material may present a resistance which is sufficient to affect the correct functioning of the assembly.

Various cleansing techniques have been tried to remove the deposited adhesive from the edges of the metal conductor patterns where the holes are drilled, but so far as we are aware none have yet proved to be fully satisfactory in practice.

A further difficulty arises from the application of heat and pressure during the bonding process. The adhesive materials used tend to flow under these conditions and accordingly there may be some movement of the various circuit boards relative to one another so that it can be difficult to maintain exact registration of the various boards. It will be understood that even a small displacement can be sufficient to cause the drilled bores to miss the areas of the metal conductor patterns which they are intended to intersect.

SUMMARY OF THE INVENTION

The object of the invention is to avoid or reduce the above-mentioned difficulties.

According to the present invention we provide a method of making a multi-layer circuit board assembly including a plurality of stacked conductor patterns interconnected electrically within the assembly comprising the stages of:

a. forming on an insulating base board having two opposite sides a first metal conductor pattern on at least one of said opposed sides to form a circuit board, b. forming on said circuit board, over said first metal conductor pattern thereon, a first continuous layer of an insulating material of such a nature that it will not smear on a drill subsequently passed through such layer, c. forming on said insulating layer a further metal conductor pattern which is totally isolated from said first metal conductor pattern, d. forming any additional alternating insulating layers and conductor patterns as may be necessary to complete the assembly and, e. drilling through the assembly at preselected positions to form bores extending through the insulating layers and the board so as to intersect the metal conductor patterns selectively at positions where they require to be electrically interconnected and subsequently depositing metal within such bores to establish such electrical interconnection.

The above-mentioned difficulties are overcome by the method in accordance with the invention due to the avoidance of the previously used bonding process coupled with the use of a material which does not tend to smear on the drill. It is to be noted that such non-smearing materials cannot in general be used in place of the adhesive utilized in the previously known process since they do not possess the required adhesive properties for bonding the individual boards together.

The insulating layers may be formed by any conventional printing process or in any other appropriate manner. The non-smearing material of which the insulating layers are formed may be a heat-hardening resin such as a cross-linked co-polymer, typically, a photoresist material comprising a U.V. cross-linked polymer of the type available under the name "Riston Dry Resist" from DuPont (U.K.) Limited. Alternatively the insulating layer may be formed from a catalyst hardened resin, e.g., a phenolic or epoxy resin.

The conductor patterns may be formed by any appropriate conventional method. For example, the insulating layer may be sensitized by a catalytic process and then subjected to a non-electrolytic metal plating process. The non-electrolytically deposited metal layer may then be electro-plated to produce a conducting layer of predetermined thickness. Such layer may then be printed and etched to remove surplus metal and leave the requisite conductor pattern.

Alternatively, the metal may be deposited in the first instance to form the requisite predetermined conductor pattern by selective electroless and electrolytic deposition of metal onto the insulating layer.

The final stage of the process may comprise the following sequential steps:

a. forming an outermost insulating layer of said non-smearing insulating material over the penultimate one of the conductor patterns which in the finished assembly will be adjacent to an outermost one of said conductor patterns, said outermost insulating layer not extending over the edges of the assembly, b. drilling through the assembly at said preselected positions, c. forming a continuous layer of a conductive metal over the whole of said outermost insulating layer and internally of the bores, but not over the edges of the assembly, d. masking said continuous layer of conductive metal with a resist shaped to correspond to the negative of the desired outermost conductor pattern and to expose parts of said continuous layer of conductive metal and also to expose said bores, e. forming a readily solderable coating on said exposed parts of said continuous coating conductive metal said readily solderable coating thereby extending internally of said bores, and f. removing all of said continuous layer of conductive metal except said parts coated with said readily solderable material thereby to form said outermost conductor pattern and establish electrical interconnection between said conductor patterns as required.

If desired, the final stage may include the additional step of forming an additional continuous layer of conductive metal over said outermost insulating layer immediately prior to drilling through the assembly. This minimizes the risk of damaging the outermost insulating layer during the drilling operation.

Usually, the preparation of the assembly would commence by forming a double-sided circuit board with a conductor pattern on each side of the board, and in this case the alternate layers of insulating material and further metal conductor patterns would be built up simultaneously on both sides of the board.

The invention also resides in a multi-layer circuit board assembly made in accordance with the method as previously defined.

BRIEF DESCRIPTION OF THE DRAWINGS

The invention will now be described by way of example with reference to the accompanying drawings wherein.

DESCRIPTION OF THE PREFERRED EMBODIMENT

Figure 1:
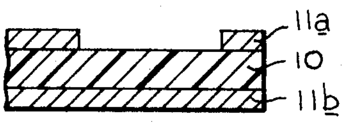
FIGS. 1 to 7 show partial transverse sections through a multi-layer circuit board assembly at various stages during its construction in accordance with the invention.

A multi-layer circuit board assembly may be formed in accordance with the invention by first making by known procedures a double-sided circuit board as shown in FIG. 1. Such a circuit board is illustrated in section in FIGURE which shows an insulating base board at 10 and at 11*a* and 11*b* metal layers formed into first conductor patterns on opposed sides of the base board 10. The manner in which the double-sided circuit board is formed is not relevant to the present invention and any known methods may be employed. For example, the opposite sides of the board 10 may initially be clad with continuous layers of copper by deposition from a solution (electroless deposition followed if necessary by electrolytic deposition) or sheets of copper foil may be adhesively secured to the board. The copper clad board may then be masked on each side with resists corresponding to the desired conductor pattern and exposed portions of the copper layers may then be etched by any suitable process so as to leave the layers 11*a* and 11*b* formed into the desired first conductor patterns.

Figure 2:
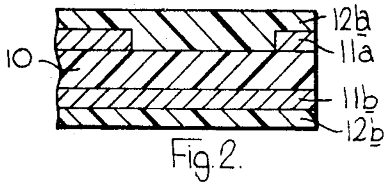
Figure 3:
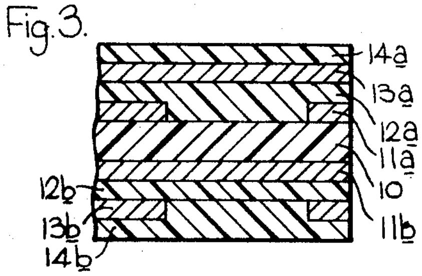

The next stage in the process comprises coating both sides of the board completely with first continuous layers 12*a* and 12*b* of an insulating material so as to cover the first conductor patterns 11*a* and 11*b* as shown in FIG. 2. In accordance with the present invention the insulating material is so chosen that it will not smear on a drill subsequently passed through such a layer. In general, it is believed that heat-hardening resins will be suitable for this purpose providing they also meet the electrical and mechanical requirements of the particular multi-layer circuit board assembly to be formed.

Thus, when the final assembly is drilled through as subsequently described, the heat generated by the drill causes the insulating material to harden rather than soften.

Certain heat hardening epoxy resins can be employed, and also certain types of cross-linked co-polymer. In particular a photo-resist material which comprises a U.V. cross-linked co-polymer commercially available under the name "Riston Dry Resist" from DuPont Company (U.K.) Limited is especially suitable. This material can be deposited onto the double-sided circuit board shown in FIG. 1 by a photo-mechanical process, but other suitable, non-photo sensitive, materials could be deposited by any normal printing process such as a silk screen process.

The next stage in the process involves the formation of further layers 13*a* and 13*b* of metal to form further conductor patterns. Again, such conductor patterns can be formed by any known process. These further conductor patterns 13*a* and 13*b* are in their turn covered by additional layers 14*a* and 14*b* of insulating material and these steps are repeated as many times as is necessary to build up the required number of layers. Thus, in the present example and as shown in FIG. 4 additional conductor layers 15*a* and 15*b* which comprise the penultimate conductor layers, are formed on the insulating layers 14*a* and 14*b* and in turn these layers may be covered by further outermost insulating layers 16*a* and 16*b* so that at this stage the opposite sides of the assembly are entirely coated with the insulating material although the edges of the assembly are not so coated.

Figure 4:
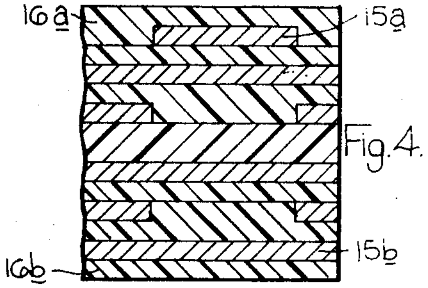

The final stage in the process involves the interconnection of the various circuit patterns and the formation of the outermost circuit patterns on the exposed outermost insulating layers 16*a* and 16*b* as shown in FIG. 4.

In order to provide the interconnections between the conducting layers shown in FIG. 4, the assembly is drilled through at appropriate positions so as to form bores such as 18 which intersect the parts of the various conductor patterns selectively at parts only where they require to be electrically interconnected. It will thus be seen that the bore 18 shown in FIG. 5 intersects the conductor patterns 15*a*, 13*a*, 11*b* and 15*b* but does not intersect the conductor patterns 11*a* and 13*b* and it will be apparent that the layout of the various circuit patterns will be so designed that those layers which require to be interconnected are in register with one another at the appropriate positions corresponding to the siting of the bores 18.

Due to the use of the selected material for forming the insulating layers, when the bores are drilled there is little risk of the exposed edge faces of the conducting layers being contaminated with the insulating material so that such exposed edge faces are available for electrical connection.

Figure 5:
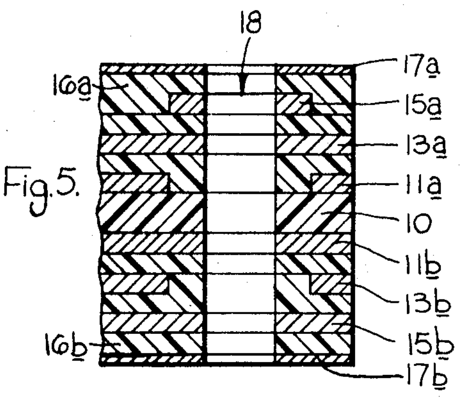

As shown in FIG. 5, the outermost insulating layers 16*a* and 16*b* may, prior to the drilling operation, be covered with respective continuous layers of conducting metal as shown at 17*a* and 17*b*. This arrangement has the advantage that the insulating layers 16*a* and 16*b* are thereby protected against mechanical damage during the subsequent drilling operation. The outermost layers 16*a* and 16*b* are also protected against contamination by subsequent handling which might affect the adhesion of the subsequently deposited metal.

Figure 6:
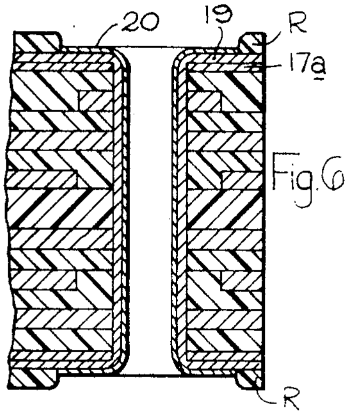

After the bores have been formed, the entire areas of the opposed sides of the assembly, and the side walls of the bores are coated with a continuous layer of conductive metal as shown in FIG. 6. Typically, the metal will be copper and the layer 19 will initially be formed by non-electrolytic deposition in known manner followed by subsequent electro-plating to build up layer to the desired thickness, a similar process being used for the formation of the preceding conducting layers. However, it is alternatively possible for other metals to be used, and in particular the conductive layers may be formed by initially depositing nickel and/or cobalt electrolessly and then subsequently electro-plating nickel and/or cobalt, or copper onto the electrolessly deposited layer.

The continuous layer of conductive metal 19 thus establishes electrical interconnection between those conductor patterns which are intersected by the bore 18, namely layers 15*a*, 13*a*, 11*b* and 15*b*.

Those portions of the layer 19 which extend over the opposite sides of the assembly can then be formed into the appropriate outermost conductor patterns.

Again, any appropriate known technique may be employed for this purpose. However, the preferred method is as follows. Firstly, the opposite sides of the assembly are masked by resists corresponding to the negatives of the desired circuit patterns so as to expose only parts of the layer 19 from which the outermost conductor pattern is to be formed, These resist layers are shown in FIG. 6 at R and are preferably formed from a photo sensitive resist material such as that previously mentioned. Additionally, the resist layers R also expose the parts of the layer 19 immediately surrounding the bores. A layer 20 of a readily solderable material such as tin is then deposited on the exposed parts of the layer 19. It will thus be apparent that the deposit of tin will cover the desired conductor patterns which are to be formed from the layer 19 and will also form a lining covering the conductive metal deposited within the bores. This can clearly be seen from FIG. 6. Other readily solderable materials which could be used, instead of tin, include tin/lead alloys, gold, nickel and the like.

Figure 7:
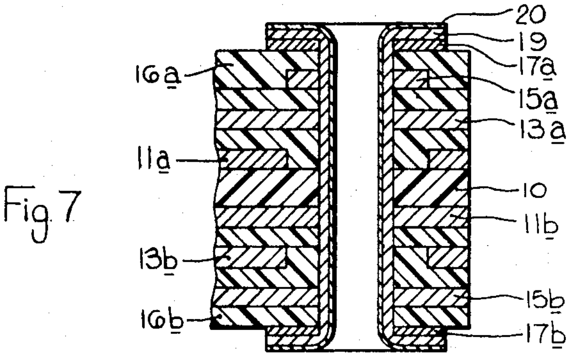

Finally, the resists R are removed and the assembly is subjected to an etching process whereby all of the conductive metal of the layer 19 is removed except the parts covered by the layer 20 of tin or the like to achieve a finished assembly as shown in FIG. 7.

It will be understood that the plated through connections as established within the bores have a substantially rivet-like form thereby facilitating the connection of external components thereto. At any point where connections are required only between internal layers of the assembly, the exposed parts of the plated through-connection would, of course, be isolated from the outermost conductor patterns formed on the exposed surfaces of the assembly. On the other hand, where electrical interconnection was required between one or more internal layers and one or both of the outermost conductor pattern, the exposed portions of the plated through-connection would then form part of the outermost conductor pattern or patterns as appropriate.

The choice of the finished metal is determined by its solderability and the chosen metal is deposited by electrolytic means on the areas of copper exposed by the photographic pattern of the desired circuit. When tin is used, a pure bright tin is deposited from a proprietary solution specially compounded for long shelf life and solderability, such as "CULMO TIN" supplied by Schlotter Ltd. When tin/lead alloy is used this is deposited from a nominal 60/40 ratio solution as is a standard procedure. When gold is used it is usually of a pure quality without alloys to present the best solderability. The thickness of the deposit is governed by its porosity standards at lower thicknesses, because it has to withstand the action of the etchant and act as an etching resist during the etching procedure. In addition to this requirement, in the case of gold, the deposit is usually much thinner and underlaid by nickel. This is to overcome the porosity of the thin coating, which is deliberately kept thin to avoid the percentage of gold in the solder joints rising to above 4–5percent when weakening would occur due to embtrittlement.

As stated above, the metal must withstand the etchant and to facilitate this the etchant is chosen to suit the particular metal used. When using bright tin, the etchant is usually of the alkaline type, such as "-Metex" marketed by Macdermid Ltd. or proprietary or non-proprietary chromic/sulphuric acid solutions. When tin/lead alloy is used the etchant is uaually ammonium persulphate. With gold, any of the above etchants may be used and also ferric chloride.

In an alternative example, the printed circuit board on which the alternate insulating layers and conductor layers are subsequently deposited may comprise a single sided board so that the subsequent layers are formed on only one side thereof.

The formation of a multi-layer circuit board assembly by the method in accordance with the invention therefore avoids the difficulties associated with establishing the requisite electrical interconnections between the various conductor layers, as well as simplifying the problems involved in the accurate registration between the various conductor layers. The invention has the further advantage that the basic circuit board which forms the central core of the multi-layer assembly can be designed to accept edge-connectors on all sides if necessary. A further advantage resides in the fact that the thickness of the deposited insulating layers can be made less than those of the pre-formed insulating boards previously employed so that a greater number of circuit layers can be produced within any given thickness.

I claim:

1. A method of making a multi-layer circuit board assembly including a plurality of stacked conductor patterns interconnected electrically with one another within the assembly, the method comprising the stages of;

a. forming on an insulating base board having two opposed sides a first metal conductor on at least one of said opposed sides to form a circuit board, b. coating said circuit board, directly over said first metal conductor pattern thereon, with a first continuous layer of an insulating resin material of such a nature that it will not soften and smear on a drill subsequently passed through such layer, c. securing directly on said first insulating layer, in the absence of heat, a further metal conductor pattern which is totally insulated from said first metal conductor pattern solely through the intermediary of said resin, d. securing, in the absence of heat, additional insulating layers and conductor patterns in alternating succession of selected quantity to substantially complete the assembly and, e. drilling through the assembly at preselected positions to form bores extending through the insulating layers and the base board so as to intersect the metal conductor patterns selectively at positions where the metal conductor patterns are to be electrically interconnected, and subsequently depositing metal within such bores to establish such electrical interconnection.

2. A method according to claim 1 wherein the non-smearing resin material of which the insulating layers are formed comprises a heat-hardening resin.

3. A method according to claim 2 wherein the resin is a cross-linked co-polymer.

4. A method according to claim 2 wherein the resin is a catalyst hardened resin.

5. A method according to claim 1 wherein the final stage of the process comprises the following sequential steps, a. prior to said drilling through the assembly, forming an outermost insulating layer of said non-smearing insulating material over a penultimate one of the conductor patterns which in the finished assembly will be adjacent to an outermost one of said conductor patterns, said outermost insulating layer not extending over the edges of the assembly, b. thereafter, effecting said drilling through the assembly at said preselected positions, c. applying a continuous coating layer of a conductive metal over the whole of said outermost insulating layer and internally of the bores, but not over the edges of the assembly, d. masking said continuous layer of conductive metal with a resist shaped to correspond to a negative of the desired outermost conductor pattern and to expose parts of said continuous layer of conductive metal and also to expose said bores, e. applying a readily solderable coating on said exposed parts of said continuous layer of conductive metal, said readily solderable coating thereby extending internally of said bores, and f. removing all of said continuous layer of conductive metal except said parts coated with said readily solderable material, by etching, thereby to form said outermost pattern and establish electrical interconnection between said conductor patterns as required.

6. A method according to claim 5 wherein the final stage includes the additional step of forming an additional continuous layer of conductive metal over said outermost insulating layer immediately prior to drilling through the assembly to form said bores.

7. A method according to claim 5 wherein said continuous layer of conductive metal which is deposited in the final stage of the process consists of a metal selected from the group consisting of copper and nickel.

8. A method according to claim 7 wherein the readily solderable coating deposited in the final stage of the process consists of a metal selected from the group consisting of tin, tin/lead, and gold.

9. A method according to claim 5 wherein said circuit board formed in the first stage of the process comprises a double-sided circuit board with said first conductor patterns on said respective opposed sides thereof, the remaining stages of the process being effected simultaneously on both sides of said circuit board.

* * * * *